Figure 1A:
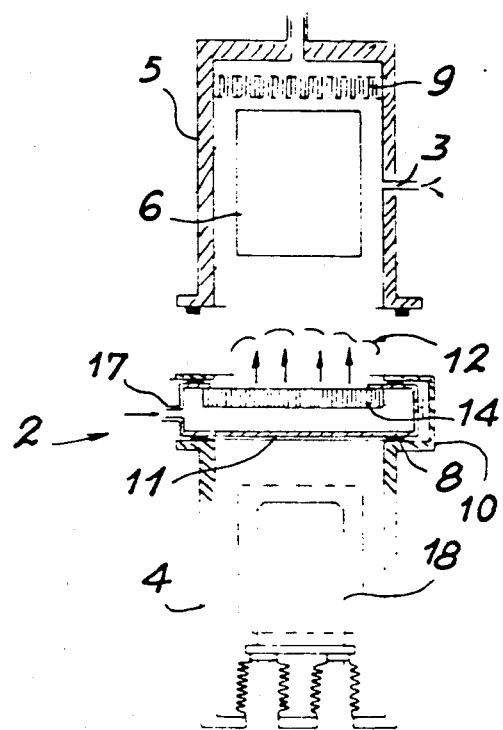

United States Patent [19]

Cruz et al.

[11] Patent Number: 5,112,277
[45] Date of Patent: May 12, 1992

[54] BLOWING DOOR FOR ULTRA-CLEAN CONFINEMENT CONTAINER

[75] Inventors: Didier Cruz, Grenoble; Jacques Daval, Meylan, both of France

[73] Assignee: Commissariat a l'Energie Atomique, Paris, France

[21] Appl. No.: 662,162

[22] Filed: Feb. 28, 1991

[30] Foreign Application Priority Data

Mar. 7, 1990 [FR] France ................ 90 02871

[51] Int. Cl.⁵ ............................................. B65G 69/00
[52] U.S. Cl. .................................... 454/195; 414/217; 454/370
[58] Field of Search ............... 98/36, 87, 115.1, 115.3; 118/719; 204/298.25; 414/217

[56] References Cited

U.S. PATENT DOCUMENTS

| 4,278,380 | 7/1981 | Guarino | 414/217 |
| 4,724,874 | 2/1988 | Parikh et al. | 414/217 X |
| 4,851,018 | 7/1989 | Lazzari et al. | 414/217 X |

FOREIGN PATENT DOCUMENTS 0340345 11/1989 European Pat. Off. .

Primary Examiner—Harold Joyce

[57] ABSTRACT

The blowing door permits the passage of an object (6) from the interior of a first container (5) to a second container (4) without the respective atmospheres of the interior of these two containers being polluted.

The blowing door (2) comprises a pressurized fluid inlet (17), an inner chamber (15) and at least one of its faces is ventilated by means of filter (14) placed between the face (11) and the inner chamber (15). During the opening of the door (2), the face (11) in contact with the external atmosphere is then ventilated, so that polluting particles are not brought into the containers (4, 5) during the closure of the door (2).

Application to the treatment of silicon wafers or chips to be used in microelectronics.

8 Claims, 5 Drawing Sheets

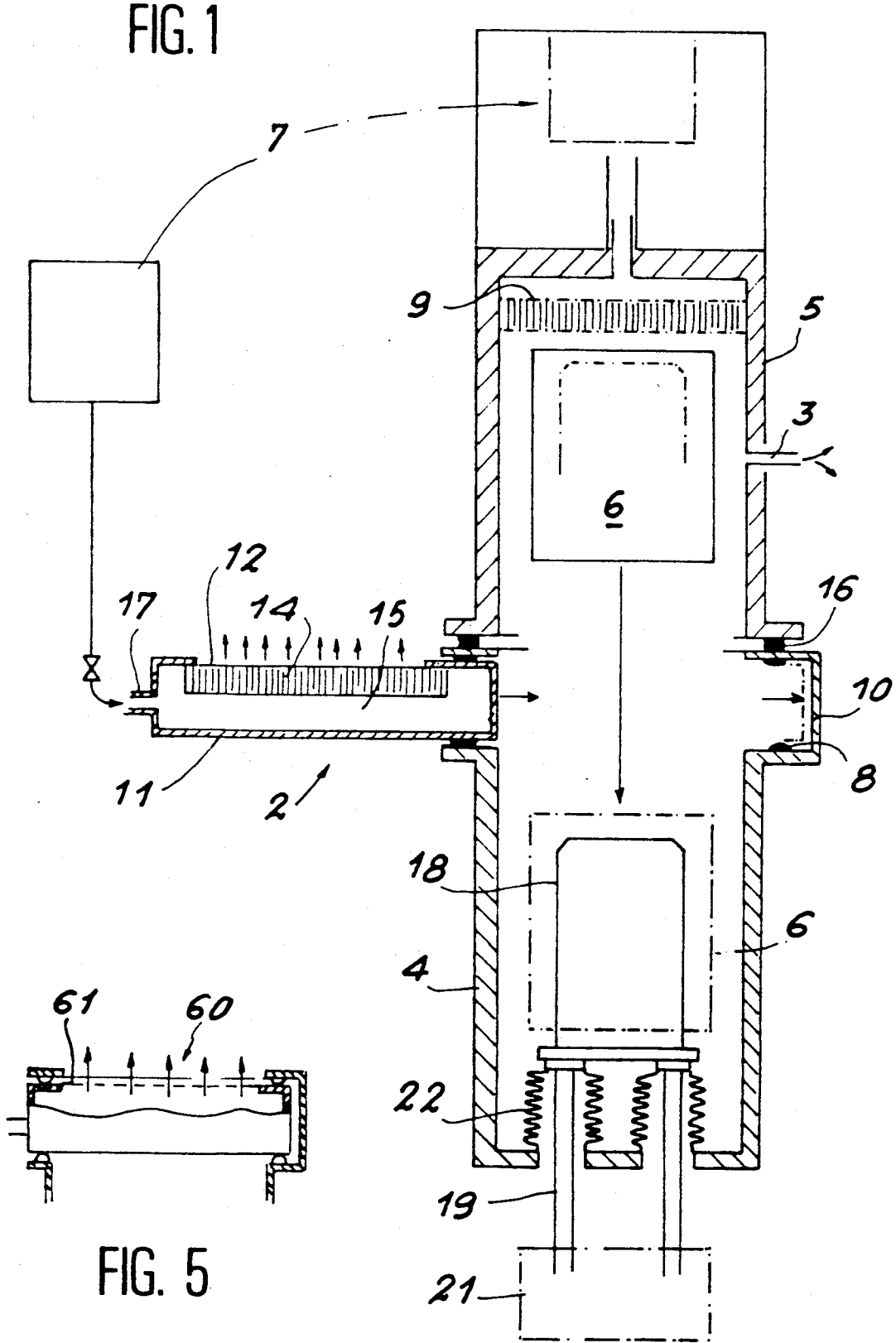

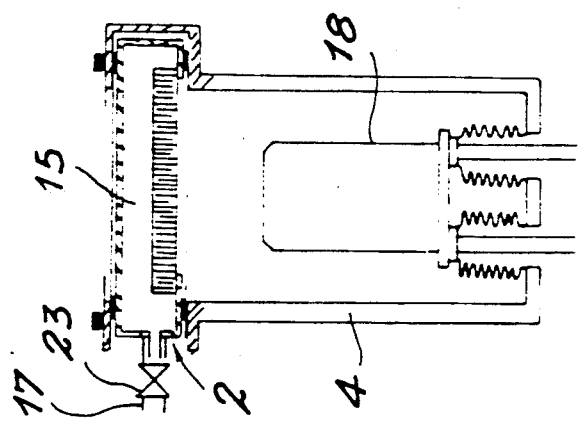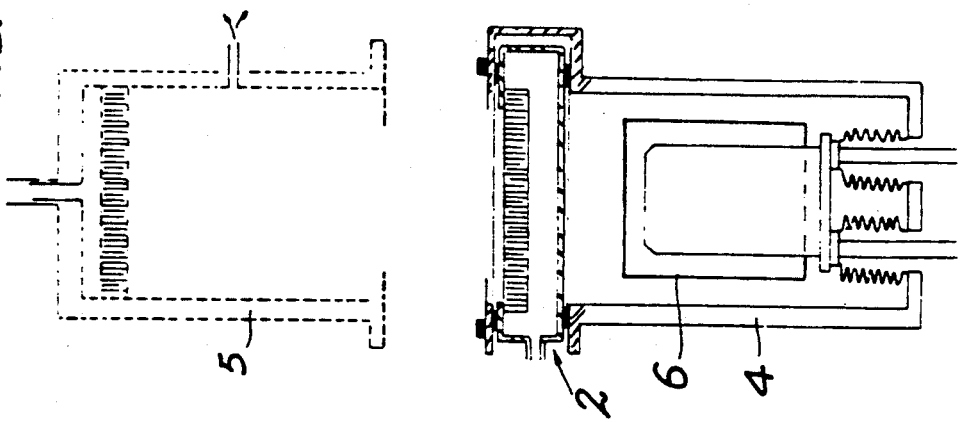

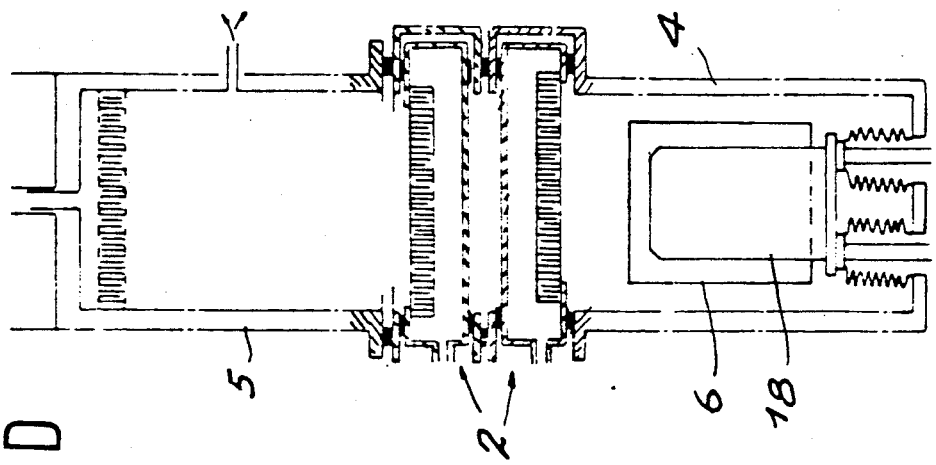
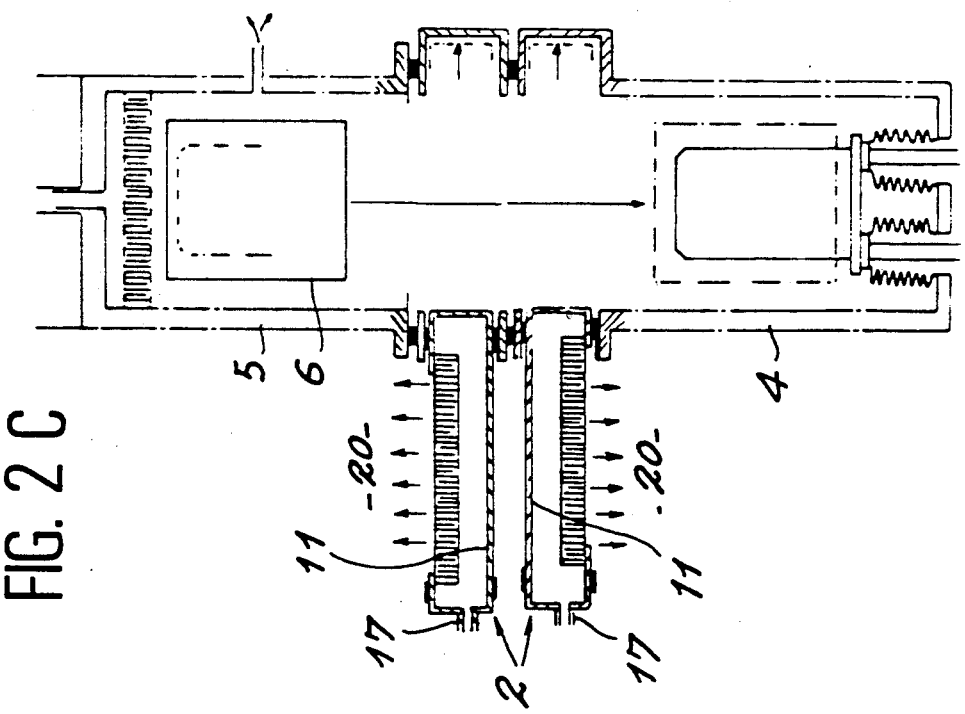

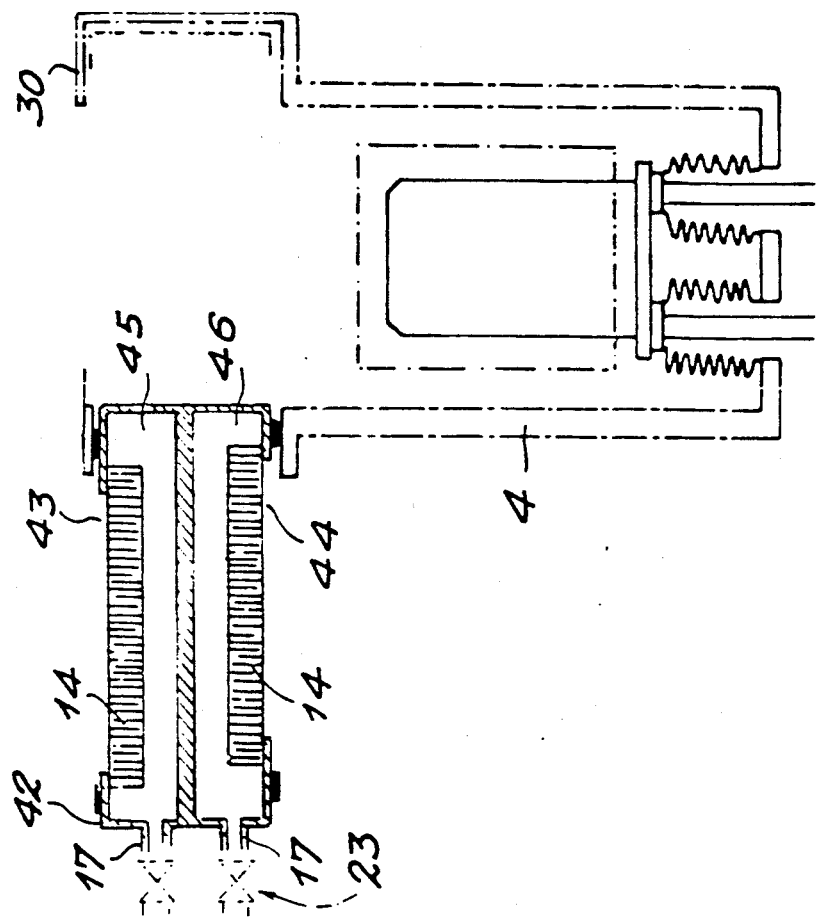
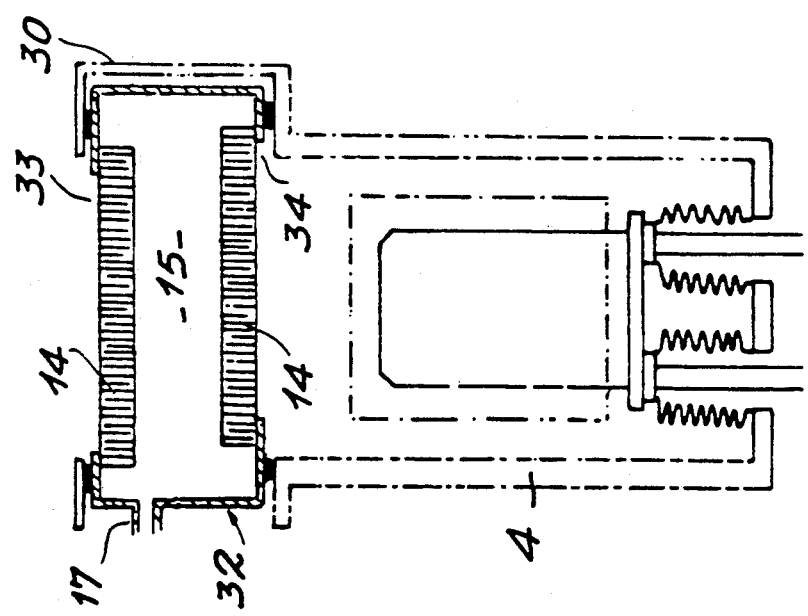

BLOWING DOOR FOR ULTRA-CLEAN CONFINEMENT CONTAINER

DESCRIPTION

The invention relates to the storage and transfer of objects which have to be periodically or constantly kept in a very clean atmosphere.

More specifically, in certain industrial fields, such as that of micro-electronics, it is necessary to maintain one or more objects, such as silicon wafers or chips used in the production of integrated circuits in an ultra-clean atmosphere. It is also necessary to frequently transfer such objects from the interior of a first container to the interior of a second container. Problems then occur relative to the simultaneous or successive opening of the two containers in question. Thus, the opening of a door requires a movement and mechanical friction leading to the emission of undesirable particles polluting the ultra-clean atmosphere. This same problem occurs during the closing of the container, when its door is put back into place and inevitably introduces particles resulting from the friction due to the opening and closing operations. These particles can also come from the outside of the container because, when the door is mounted in a sliding manner, at least one of its faces is, in the open position, in contact with a much less clean atmosphere.

The problem which the invention aims at solving is that of permitting an interchange of objects between two "ultra-clean" containers without introducing more or less polluted or polluting particles into the atmospheres prevailing within the two containers.

Thus, the invention mainly relates to a blowing door for an ultra-clean confinement container intended to hermetically seal a first container which can be coupled to a second container and in which the door has to be moved so as to permit the passage of objects from one of the two containers into the other, when the latter are coupled. The first face of the door is liable to face the interior of the first container. There are means for fixing the door to the first container.

According to the invention, ventilation means are provided for at least one face of the door in order to maintain an ultra-clean atmosphere in the area closely surrounding the same and facing said ventilated face. The invention also provides for first sealing means on the first face of the door facing the interior of the first container. The invention also aims at adapting the blowing door concept to sliding doors.

To this end, the door is mounted so as to slide in a door frame which is placed on the opening of the first container. It carries first sealing means placed against the first face of the door and second sealing means placed on the said frame and which are to be applied against fixing means with the second container.

One of the advantages of the blowing door according to the invention is that it can be used with a second container, which is either statically or dynamically sealed. Thus, the connecting means with the second container can be constituted either by the opening of said second container which then has a dynamic seal, or by a second blowing door, identical to the blowing door according to the invention, the two respective faces of the two doors facing the exterior being positioned facing one another. In this case, the second container has a static seal.

According to the main embodiment of the ventilation means, the latter are constituted by a first pressurized fluid feed pipe supplying a first fluid chamber located within the blowing door and issuing onto the first face of said door by a first filter.

One of the aims of the invention is also to propose a single blowing door usable with two containers having dynamic sealing. To this end, the door comprises means for ventilating its second face in order to maintain an ultra-clean atmosphere in the environment closely facing the second face. Here again, two constructions are possible.

In the first construction the second ventilation means of the second face are constituted by a second pressurized fluid supply or feed pipe supplying a second fluid chamber positioned within the door and issuing onto the second face of said door via a second filter. In the second construction the second ventilation means are constituted by the first means, supplemented by a second filter issuing onto the second face of the door.

With a view to using in a rational manner the blowing door according to the invention on containers having dynamic or static sealing, a valve positioned upstream of the fluid chamber is provided for the ventilation means. This makes it possible to maintain the container under pressure or not under pressure when it is sealed by the door.

The invention also relates to an ultra-clean container equipped with a blowing door of the type described hereinbefore, the door frame forming an integral part of the container.

The advantages and technical characteristics of the invention can be gathered from the following non-limitative description relative to the following drawings, wherein it is shown:

FIG. 1: A diagram of a first embodiment of the blowing door according to the invention shown with two containers with which it is used.

FIGS. 1A, 1B, 1C, 1D and 1E: Diagrams showing the different phases of the use of the door shown in FIG. 1.

FIG. 2A: A second embodiment of the blowing door according to the invention fixed to a container with which it is used.

FIGS. 2B, 2C and 2D: Diagrams showing the different stages of the operation of the door shown in FIG. 2A.

FIG. 3: A third embodiment of the blowing door according to the invention fixed to a container with which it is used.

FIG. 4: A fourth embodiment of the blowing door according to the invention fixed to a container with which it is used.

FIG. 5: A fifth embodiment of the blowing door according to the invention without a filter.

To illustrate the concept of the blowing door according to the invention, FIG. 1A shows the first embodiment of the said door 2, fixed to a container 4, which for the present is empty. This diagram only constitutes an exemplified use of the first embodiment and the container 4 can contain one or more objects. To make the usefulness of the invention clearer, it can be imagined that the container 4 is an empty transfer container prior to being filled with one or more objects to be stored. In the present case it receives an object 6 which has previously been stored in a second container 5, which can be a storage container. The storage container 5 is shown without a door, which means that it is a dynamically sealed container. As the invention applies to the treatment of objects in an ultra-clean atmosphere, the storage container 5 is connected to an ultra-clean fluid source 7, which is preferably air, but which can also be argon or nitrogen and which issues into the interior of the storage container 5, preferably via a filter 9. Thus, the object 6 is temporarily placed in the storage container 5 among fine ultra-clean air streams from the filter 9 leaving the container 5 through an opening in the latter.

The blowing door 2 is fixed to the transfer container 4 by a first face 11, in this case the inner face, which is positioned facing the interior of the transfer container 4. First sealing means are provided between the transfer container 4 and the door 2 and are constituted in preferred manner by a first joint 8, such as an O-ring. More specifically, the blowing door 2 is fixed to the transfer container 4 via a frame 10 supporting the door 2.

The door frame 10 is shown integral with the transfer container 4, but can constitute a part which is separate therefrom. In the second case, it is fixed to the transfer container 4 by conventional fixing and sealing means. For example, said frame 10 can be mounted so as to pivot relative to the transfer container 4 by means of a door hinge or hook at a first end, the second end being brought against the container 4 where it is fixed by means of a latch, clip or screw. Once fixed to the transfer container 4, the frame 10 enables the blowing door 2 to slide, so as to give access to the interior of the transfer container 4. The first sealing joint 8 constituting the first sealing means is more specifically placed between the blowing door and the door frame 10.

A second, outer face 12 of the door 2 faces the storage container 5. If there is a normal atmosphere, i.e. without any particular degree of cleanness, prevails around these two containers 4 and 5, it is clear that the outer face 12 of the blowing door 2 may pollute the interior of the storage container 5 if the latter is placed against said outer face 12 by its opening. Thus, various particles, such as dust, are located in large numbers on said outer face 12, as on all the walls of the objects located in said atmosphere without any particular degree of cleanness.

In order to obviate this disadvantage, the invention equips the door 2 with ventilation means for maintaining the outer face of the door 2, or more specifically its close environment, under an ultra-clean atmosphere. Thus, when the storage container 5 is approached by said outer face 12, its interior is not polluted by any particles which might be located on said face 12. In FIG. 1A, the ventilation means are represented by the pressurized, clean fluid source 7, to which is connected a pipe 17 issuing within the blowing door 2 into a chamber 15 extending within the door 2 in order to issue onto the outer face 12 via a filter 14.

So as to also ensure the seal between the blowing door 2 and the storage container 5, second sealing means are located between the frame 10 and the storage container 5. They can be constructed in an identical manner to the first sealing means in the form of a joint 16. Each of the containers 4 and 5, like the door frame 10 are provided with conventional, respective fixing means.

As stated hereinbefore, the frame 10 can form an integral part of one of these two containers 4, which is then permanently equipped with the same door.

The drawings show gripping means and means for transferring the object 6 from one container to the other. These means do not form part of the present invention, but are necessary for passing the object between the containers. They can be constituted in the case of a first container by a plate 18 on which rest the stored or transported objects 6. This plate 18 is mobile in translation by means of two manipulating rods 19 traversing the container walls by means of bellows 22. A control device 21 located on the outside manipulates the said transfer means. The other container need not have these transfer means and can merely be equipped with means for holding the object or objects.

At the start of a cycle of interchanging objects between individual containers, when the two containers 4 and 5 are coupled together and one of them has a dynamic seal, like the storage container 5 in FIG. 1A, the pressure within the same increases and stabilizes at a predetermined value, by means of a leakage or escape opening 3 by which the pressurized air escapes to the outside of the container 5.

Figure 1B:
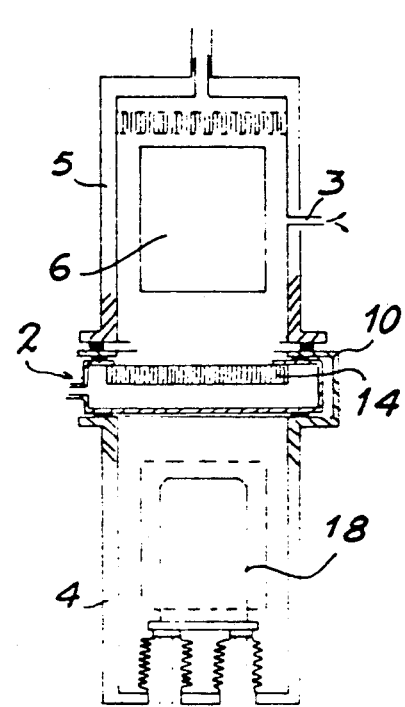

FIG. 1B diagrammatically illustrates this phase of the process of using the door according to the invention, i.e. the object 6 is still in the storage container 5 under a pressurized, ultra-clean atmosphere. The containers 4 and 5 are coupled together by the frame 10, but the blowing door 2 is still closed.

On referring to FIG. 1B, the two containers 4 and 5 remain coupled together by means of the door frame 10 and the sealing joints 8 and 16.

Figure 1C:
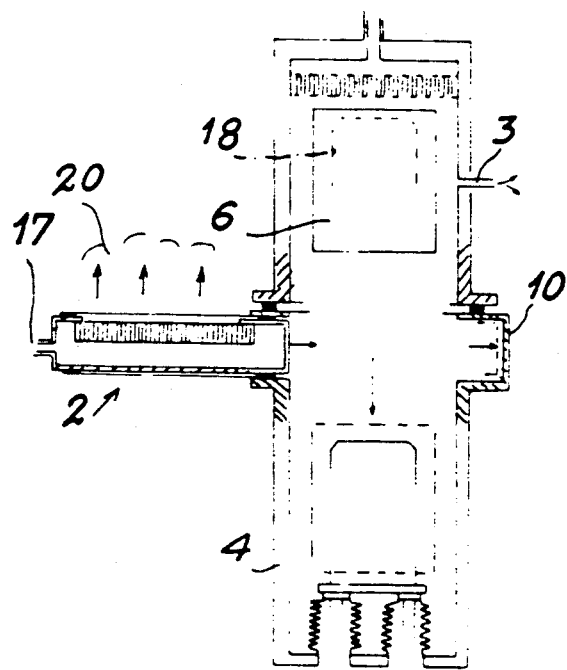

On referring to FIG. 1C, the blowing door 2 is then translated by sliding within the frame 10. This operation can be carried out automatically or manually e.g. by pulling on the pipe 17 of the pressurized air source. The chamber 15 of the blowing door 2 is supplied with air and the outer face 12 of the door 2 is consequently ventilated, so that its near environment is under an ultra-clean atmosphere. This clean zone is represented by the cloud effect 20. With the aid of transfer means, the object or objects 6 can be interchanged between containers.

Figure 1D:
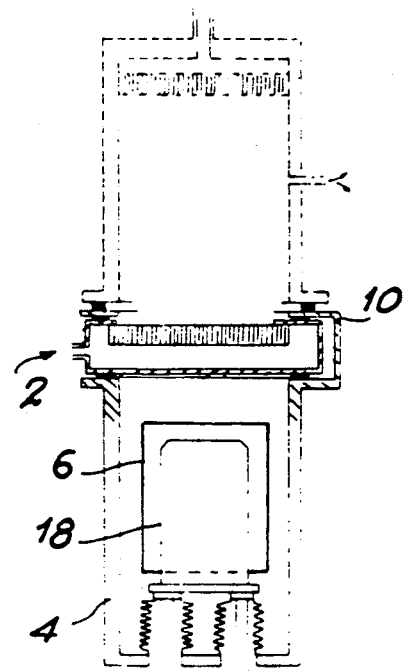

As illustrated in FIG. 1D, the blowing door 2 can then be closed again, i.e. pushed in the opposite direction so as to reassume its initial position in the door frame 10. In this case, the inner face 11 of the blowing door 2 has been in contact with the external atmosphere. Thus, once the blowing door 2 has been closed again, said inner face 11 is in contact with the interior of the transfer container 4. Therefore said inner face 11 is liable to contaminate the interior of said transfer container 4. Thus, in this embodiment, it is assumed that the requirements within the transfer container 4 are not those required for the storage of objects under an ultra-clean atmosphere. This slight disadvantage is eliminated in the other embodiments of the blowing door according to the invention.

On referring to FIG. 1E, the storage container 5 can finally be disengaged from the assembly formed by the blowing door 2, its frame 10 and the transfer container 4.

In the second embodiment of the blowing door according to the invention, represented by FIGS. 2A, 2B, 2C and 2D, the door is provided with a valve 23, placed on the pressurized air pipe 17 upstream of the chamber 15. This valve 23 permits the in situ control of the supply of chamber 15 of the blowing door 2, as a function of the use made of the said door. Thus, to obviate the minor disadvantage referred to hereinbefore, it is possible to have a blowing door with the inner wall ventilated. This amounts to the use of the blowing door described hereinbefore, whilst turning the same round, so that its face, which formed the outer face 12 in FIGS.

1A to 1E now becomes the inner face in FIGS. 2A to 2D. The interior of the storage container 4 can then be exposed to a pressure transmitted by the blowing door.

On referring to FIG. 2B, it can be seen that such a door can be used in a different manner from that described hereinbefore.

Thus, it is possible to envisage each of the two containers 4 and 5 to be coupled together, each provided with a blowing door, in the manner shown in FIG. 2A. Each of these blowing doors 2 is then temporarily or permanently mounted on a container, so that the face previously forming the outer face 12 is on the interior of the container which it seals. Each of the two blowing doors 2 is completed by a door frame 10. In this case, the means for fixing one container to the other are also constituted by conventional fixing members between the two door frames 10. By making the two previously inner faces 11 of the two blowing doors 2 face one another, it is thus possible to couple together the two containers 4 and 5. This method of using the blowing door according to the invention with its ventilated face towards the interior of the containers more particularly applies to the transfer of objects between two statically sealed containers, the aim of the invention being not to contaminate the internal volume of each of the said containers.

This use process is preferably used with two containers under pressure. Once the latter have been contacted via the respective blowing door thereof, the valves 23 are opened, but without pressurized fluid being supplied from the pressurized fluid source. There is then a pressure drop within the two containers 4 and 5 until it reaches the atmospheric pressure value.

On referring to FIG. 2C, the two joined together blowing doors 2 are translated towards the outside in order to permit the passage of the object 6 stored in the storage container 5 to the transfer container 4. As the two doors 2 are then in a contaminated environment, the respective chambers 15 of the two blowing doors 2 are placed under pressure by the arrival of pressurized fluid by means of the pipe 17. The near environment of the outer surfaces 12 of the two blowing doors 2 is consequently maintained in an ultra-clean atmosphere.

As is shown in FIG. 2D, once the passage of the object 6 from the storage container 5 into the transfer container 4 has taken place, the two blowing doors 2 are translated so as to re-seal the passage between the two containers 4 and 5. The outer surfaces 12 of these two blowing doors 2 have been maintained under an ultra-clean atmosphere during the opening of the two doors 2, so that the internal environment of the containers 4 and 5 is not contaminated. The pressure rises within the two containers 4 and 5. When it reaches the desired pressure value the valves 23 are closed and the two containers 4, 5 are maintained under their operating pressure, either because they are statically tight, i.e. hermetically sealed, or because they are dynamically sealed with an escape opening 3. The two containers 4 and 5 can then be disengaged by disengaging the two door frames 10.

On referring to FIG. 3, a third variant of the blowing door according to the invention consists of equipping a single blowing door 32 with two faces 33 and 34, each equipped with a filter 14. The inner chamber 15 of the door 32 is still connected to a pipe 17 from a pressurized fluid source, so that the two faces 33, 34 of the door 32 are constantly maintained under an ultra-clean atmosphere by fluid streams from the chamber 15 and passing through the filters 14. In this case, the door frame 30 is in contact both with the two containers 4 and 5, still by means of two sealing joints 8 and 16. This solution makes it possible to have a perfectly clean door 32, no matter what the state of its environment. This type of blowing door 32 can be used for containers having to operate at an internal pressure identical to that of the external environment. In addition, a single door is sufficient for a pair of containers.

A fourth embodiment of the blowing door according to the invention is illustrated by FIG. 4. It is placed in the same frame 30 used with the door of FIG. 3. This blowing door 32 is a double door, i.e. it is constituted by the two doors simultaneously used in FIGS. 2A, 2B, 2C and 2D. A filter issues onto each of the two faces 43 and 44. However, each of the two faces and their filter 14 is provided with a different internal chamber 45 and 46. Each of the two chambers 45 and 46 is connected to a pressurized air source via a pipe 17 equipped with a valve 23.

This embodiment is intended to be adapted to containers having to operate in vacuo or under pressure. The blowing door types illustrated by FIGS. 3 and 4 permit, in a contaminated environment, transfers of objects between a statically sealed container, e.g. a sealed case, and another, dynamically sealed container, i.e. an open, ventilated case without contaminating the respective internal volumes of the two containers.

The two latter embodiments avoid the disadvantage inherent in the first. More specifically, the inner face of the door cannot be contaminated when it is open, i.e. as can be the case in FIGS. 1C and 1D.

In the embodiments described hereinbefore, the pressurized fluid may have a varying degree of cleanness, which requires the integration of one or two filters onto the door. However, according to FIG. 5, it is possible for the fluid from pipe 17 to have already undergone very considerable filtration in such a way that its cleanness corresponds to that of the internal volumes of these two containers. In this case, it is possible to replace the previously used filters by one or two relatively flat diffusers 60 on a face 61. It is e.g. possible to use finely perforated sheet metal, porous films, papers, ceramics or screens, their function being to homogenize the discharged fluid flows.

The embodiments described hereinbefore only constitute exemplified uses of the invention. Obviously variants can be conceived without passing beyond the scope of the invention.

We claim:

1. A blowing door for an ultra-clean confinement container intended to hermetically seal a first container coupled to a second container to permit the passage of a flat object from said first container to said second container, said first container having at least one opening and an interior portion, said second container having at least one opening and an interior portion, said blowing door comprising:

a first face slidably fitting over the opening of said first container and facing the interior portion of said first container;

a second face opposite said first face, said first face and second face defining an inner chamber therebetween;

sealing means for fixing said first face to said first container; and ventilation means for said second face of said blowing door such that an ultra-clean atmosphere is maintained in an environment immediately facing said second face.

2. A blowing door according to claim 1, comprising: a supporting frame, said sealing means comprising first sealing means and second sealing means disposed on said frame and at the opening of the said first container, said first sealing means being positioned inside the frame and between said first face of said blowing door and said frame, said first sealing means adapted to allow said blowing door to slide into said frame by covering the opening of said first container, said second sealing means being positioned outside said frame between said frame and the opening of said second container.

3. A blowing door according to claim 1, comprising a filter disposed on said second face of the said blowing door opposite said first face of the blowing door, and a first pressurized fluid inlet disposed on said ventilation means for supplying fluid to said inner chamber of said blowing door, to permit fluid to exit through the filter of said second face.

4. A blowing door according to claim 1, which further comprises ventilating means disposed at said first face of said blowing door to maintain an ultra-clean atmosphere in an environment immediately facing said first face.

5. A door according to claim 4, wherein said blowing door comprises a first blowing door and second blowing door, said first blowing door being positioned adjacent said second blowing door, such that the second face of the first blowing door is outwardly disposed and facing the first container and the second face of the second blowing door is outwardly disposed and facing the second container, said second ventilation means having a second pressurized fluid inlet for supplying fluid to a second inner chamber of the second blowing door, said fluid exiting through the second face of the second blowing door.

6. A door according to claim 4, comprising a second filter disposed in said second ventialtion means opposite said first filter of said blowing door.

7. A door according to claim 4, comprising in each said ventilation means a valve on the pressurized fluid inlet and upstream of the inner chamber of said blowing door.

8. An ultra-clean confinement container which comprises a blowing door according to claim 2, wherein said frame forms an integral part with said ultra-clean confinement container.

* * * * *